United States Patent
Evers et al.

[19]

[11] Patent Number: 6,126,062
[45] Date of Patent: Oct. 3, 2000

[54] NON-CONDUCTIVE AND SELF-LEVELING LEADFRAME CLAMP INSERT FOR WIREBONDING INTEGRATED CIRCUITS

[75] Inventors: Sven Evers; Craig T. Clyne, both of Boise, Id.

[73] Assignee: Micron Technology, Inc., Boise, Id.

[21] Appl. No.: 09/054,227

[22] Filed: Apr. 2, 1998

[51] Int. Cl.[7] ............... B23K 5/22; B23K 37/00; B23K 31/12; B23K 31/02

[52] U.S. Cl. ............... 228/212; 228/44.7; 228/106; 228/180.5

[58] Field of Search ................. 228/106, 180.1, 228/180.21, 212, 213, 5.5, 44.3, 44.7, 49.1, 1.1, 4.5, 110.1, 180.5

[56] References Cited

U.S. PATENT DOCUMENTS

| | | |
|---|---|---|
| 3,566,207 | 2/1971 | Adams . |
| 3,685,137 | 8/1972 | Gardiner . |
| 4,030,657 | 6/1977 | Scheffer . |
| 4,361,261 | 11/1982 | Elles et al. . |
| 4,434,347 | 2/1984 | Kurtz et al. . |
| 4,527,730 | 7/1985 | Shirai et al. . |
| 4,600,138 | 7/1986 | Hill . |
| 4,603,803 | 8/1986 | Chan et al. . |
| 4,653,681 | 3/1987 | Dreibelbis et al. . |
| 4,765,531 | 8/1988 | Ricketson et al. ............ 228/179 |
| 4,778,097 | 10/1988 | Hauser . |
| 4,821,945 | 4/1989 | Chase et al. . |
| 5,035,034 | 7/1991 | Cotney . |
| 5,114,066 | 5/1992 | Amador et al. . |
| 5,148,959 | 9/1992 | Cain et al. . |
| 5,173,766 | 12/1992 | Long et al. ............ 257/687 |
| 5,197,652 | 3/1993 | Yamazaki . |
| 5,217,154 | 6/1993 | Elwood et al. . |
| 5,307,978 | 5/1994 | Ricketson et al. ............ 228/4.5 |
| 5,322,207 | 6/1994 | Fogal et al. . |
| 5,384,155 | 1/1995 | Abbott et al. . |
| 5,421,503 | 6/1995 | Perlberg et al. . |
| 5,425,491 | 6/1995 | Tanaka et al. . |
| 5,445,306 | 8/1995 | Huddleston . |
| 5,465,899 | 11/1995 | Quick et al. . |
| 5,611,478 | 3/1997 | Asanasavest . |
| 5,647,528 | 7/1997 | Ball et al. . |
| 5,659,201 | 8/1997 | Wollesen ............ 257/758 |
| 5,877,555 | 3/1999 | Leighton et al. . |
| 5,890,644 | 4/1999 | Ball . |
| 5,954,842 | 9/1999 | Fogal et al. . |

OTHER PUBLICATIONS

H.K. Charles; "Electrical Interconnection"; pp. 224–236.

*Primary Examiner*—Patrick Ryan
*Assistant Examiner*—Kiley Stoner
*Attorney, Agent, or Firm*—Trask, Britt & Rossa

[57] ABSTRACT

A leadframe clamping apparatus includes a resilient polymeric membrane which permits self-leveling compensation of a variably movable clamp insert for variations in leadframe thickness. The clamp insert is formed of a polymer such as polyimide to provide further compensation for leadframe variations.

13 Claims, 6 Drawing Sheets

NON-CONDUCTIVE AND SELF-LEVELING LEADFRAME CLAMP INSERT FOR WIREBONDING INTEGRATED CIRCUITS

BACKGROUND OF THE INVENTION

1. Field of the Invention

This invention relates generally to the manufacture of semiconductor devices. More particularly, the invention pertains to methods and apparatus for clamping portions of leadframes for making conductive wire connections (wire bonds) between portions of the leadframe and the bond pads of the semiconductor device.

2. State of the Art

Semiconductor packages are formed in a variety of different designs. Among the various package configurations are dual in-Line packages (DIP), zig-zag inline packages (ZIP), small outline J-bends (SOJ), multi-level leads-on-chip (MLLOC), tape-under-frame (TUF), thin small-outline packages (TSOP), plastic leaded chip carriers (PLCC), small outline integrated circuit (SOIC), plastic quad flat pack (PQFP), thin quad flat pack (TQFP), and interdigitated leadframe (IDF). Wirebonding of each type of package requires a leadframe clamping device with particular dimensions and/or features.

In general, all package designs have several common elements. These include a sealed package enclosure, a die-attachment area, bonding wires for making electrical contact between the bond pads of the die and the leads of the package, and the inner and outer portions of lead fingers of the metal lead system of the package.

Typically, the leads of a leadframe for a semiconductor device are first formed in multiple pattern units in a leadframe, a metal strip with multiple bonding sites, each of which provides the leads for the packaged device and, in some instances, may provide support for the semiconductor device. A typical conventional leadframe strip is produced from metal sheet stock, such as a copper alloy, and has "paddles" upon which the semiconductor devices are mounted. During the wirebonding process the leadframe strip is moved and indexed from bonding site to bonding site through a clamping apparatus which retains the leadframe strip at sequential bonding sites for producing a plurality of wire-bonded semiconductor devices. The typical conventional bonding machine is designed with parallel non-resilient upper and lower clamping surfaces.

The wirebonding process comprises attaching fine or small diameter wires to bond pads on the semiconductor device and to portions of the leadfingers of the leadframe strip. The wirebonded semiconductor devices are then further processed or encapsulated into packaged semiconductor devices.

As manufactured, leadframe strips typically vary in width, camber, and thickness. For example, a leadframe strip may vary in thickness from edge to edge. Even small differences in thickness from one leadfingers to another may significantly affect the clamping effectiveness during the wire bonding process. Lead fingers which move during the wire bonding process may tend to be insufficiently bonded or have poor wire bonds, and, as a result, ultimately fail.

The result of such leadframe variations has been recognized for a long time, and the patent literature shows various apparatus directed toward resolving the problem.

U.S. Pat. No. 4,765,531 of Ricketson et al. discloses a wirebonding workstation with a planar upper clamp plate having a window.

U.S. Pat. No. 5,307,978 of Ricketson et al. discloses a leadframe clamping apparatus having an upper clamp plate with a window. This is a conventional clamp plate used on Kulicke and Soffa wirebonding machines.

U.S. Pat. No. 5,647,528 of Ball et al. and U.S. Pat. No. 5,197,652 of Yamazaki disclose dual leadframe clamping apparatus. Primary fixed clamps are augmented with a secondary independent clamp which moves with the bonding apparatus from leadfinger to leadfinger. The independent clamp of Ball et al. may include insulation or cushioning on its end, or be equipped with a spring, to control the compression force on the individual leadfinger.

U.S. Pat. No. 3,566,207 of Adams discloses a clamping apparatus for holding a leadframe in place while an integrated circuit chip is bonded to a chip mounting pad. The clamping apparatus consists of a pair of narrow clamps, each of which is pressed downward on a leadfingers of the leadframe.

In U.S. Pat. No. 3,685,137 of Gardiner, multiple anvils are positioned over leadfingers to clamp them downwardly against a plunger.

U.S. Pat. No. 4,821,945 of Chase et al. describes a leadframe clamping apparatus, in which a clamp adjacent the wirebonding capillary clamps the lead finger being wirebonded against movement.

For example, U.S. Pat. No. 5,035,034 of Cotney discloses a metal clamp frame with a clamp insert. The insert includes a series of flexible fingers, each of which is positioned to clamp one of the leadfingers on the leadframe. The Cotney invention requires a separate clamp insert for every device having a slightly different pattern, number or length of leadfingers. Thus, each insert is very product-specific. Moreover, the manufacture of such a clamp insert wherein all of the flexible fingers provide the same clamping force, even after extended use, is conceivably difficult and expensive. The individual clamping fingers are fragile and easy to distort. Weakening or breakage of a single flexible finger will require replacement and/or the fabrication of a completely new insert.

U.S. Pat. No. 5,322,207 of Fogal et al. describes a leadframe clamp with dual wirebonding windows for wirebonding two semiconductor dice at a time, i.e. without moving the leadframe. A heating block is configured to simultaneously heat the paddle contact areas of both leadframe "frames".

While prior art clamping devices are acceptable, they suffer from a common drawback, i.e., the inability to easily accommodate dimensional variations in the leadframe strip. Wirebond failures resulting from such variations are unacceptable in the current state of integrated circuit (IC) semiconductor device manufacture. A self-leveling clamping apparatus is needed which is inexpensive to construct, quickly adaptable to all leadframe sizes and types, permits rapid wire-bonding of the leads of the leadframe to the bond pads of the semiconductor device, and which significantly reduces damage to wirebonds and leads.

BRIEF SUMMARY OF THE INVENTION

The invention comprises an improvement in an apparatus for clamping a substrate; e.g., leadframe to a wirebonding machine for performing an integrated circuit wirebonding operation. In the invention, a polymeric clamp insert with a wirebonding window and a clamping surface is inserted in a clamp holder. A thin resilient membrane is placed above the clamp insert. The clamp insert has sufficient "play" or latitude of movement so that the clamp insert is self-leveling or self-adjusting on the leadframe upon application of a clamping force. The resilient member ensures that the clamp insert is nearly uniformly compressed downwardly on the leadfingers about the die, irrespective of side-to-side or end-to-end thickness variations in the leadframe.

The resilient member also acts as a dampener to absorb mechanical shocks which may otherwise damage the leadframe, die or bondwires.

The apparatus of the invention may be incorporated in a multi-member self-levelling or self-adjusting insert member which is inserted into a clamp insert carrier. The insert member has a wirebonding window surrounded by a narrow clamping surface wherein compensation for non-uniform leadframe thickness is provided. Preferably, the insert member is formed of a polymer whereby additional advantages accrue from both the non-conductive electrical property, the low heat conductive property of the insert device, and the degree of elasticity in the polymeric leadframe insert itself. The insert member is configured to provide the required compensation without permanent deformation.

In one form the clamp apparatus of the invention includes (a) a clamp insert holder with an insert aperture therethrough, (b) a clamp insert with a bonding window and a clamping surface to contact the leadframe, (c) an elastic member formed of a polymeric material, e.g. a polytetrafluoroethylene material or a urethane material, and (d) a retaining member which retains the elastic member in a position biased against the insert.

The insert has a generally peripheral clamping surface or ridge, and is formed of a non-conductive polymer having a low thermal conduction rate, such as a polyimide material, or other suitable type material. The insert is positioned in the insert aperture of a metal clamp insert carrier and extends therethrough to provide a peripheral clamping surface against the leadframe about a die adhered to a leadframe paddle. The insert and elastic member are held in place during clamping by a retainer, typically formed of a removable metal plate.

A variety of clamp inserts may be formed for differing semiconductor device/leadframe configurations. Each clamp insert may be used for wirebonding different semiconductor devices, thus minimizing the number of required inserts in a wirebonding operation. Thus, while the clamp inserts may be considered as product specific, each insert may typically accommodate a variety of package types or sizes. Moreover, the clamp inserts are easily and quickly exchanged i.e. installed and removed, for wirebonding different packages with the same insert carrier.

Using a generic insert carrier applicable to a particular leadframe width, inserts of various product-specific dimensions may be formed for wirebonding a wide variety of semiconductor packages including DIP, ZIP, TUF, SOJ, TSOP, PLCC, SOIC, PQFP, TQFP and IDF.

The thin member comprises a layer of a compressible elastic material which acts as a dampener and a self-levelling or self-adjusting device. Upward forces exerted by the leadframe against the insert by non-uniform leadframe width, etc. are absorbed by the layer of elastic material, ensuring a generally uniform clamping force over the entire clamping surface.

In addition, heat losses from the leadframe and die are much reduced by the clamp insert which has a low heat conductivity.

Furthermore, the electrically non-conductive nature of the clamp insert avoids damage to the die, leadframe and wires due to accidental electrical discharge, e.g. shortcircuits.

BRIEF DESCRIPTION OF THE DRAWINGS

The invention is illustrated in the following figures, wherein the elements are not necessarily shown to scale.

DESCRIPTION OF THE ILLUSTRATED EMBODIMENTS

Figures 1, 1A:
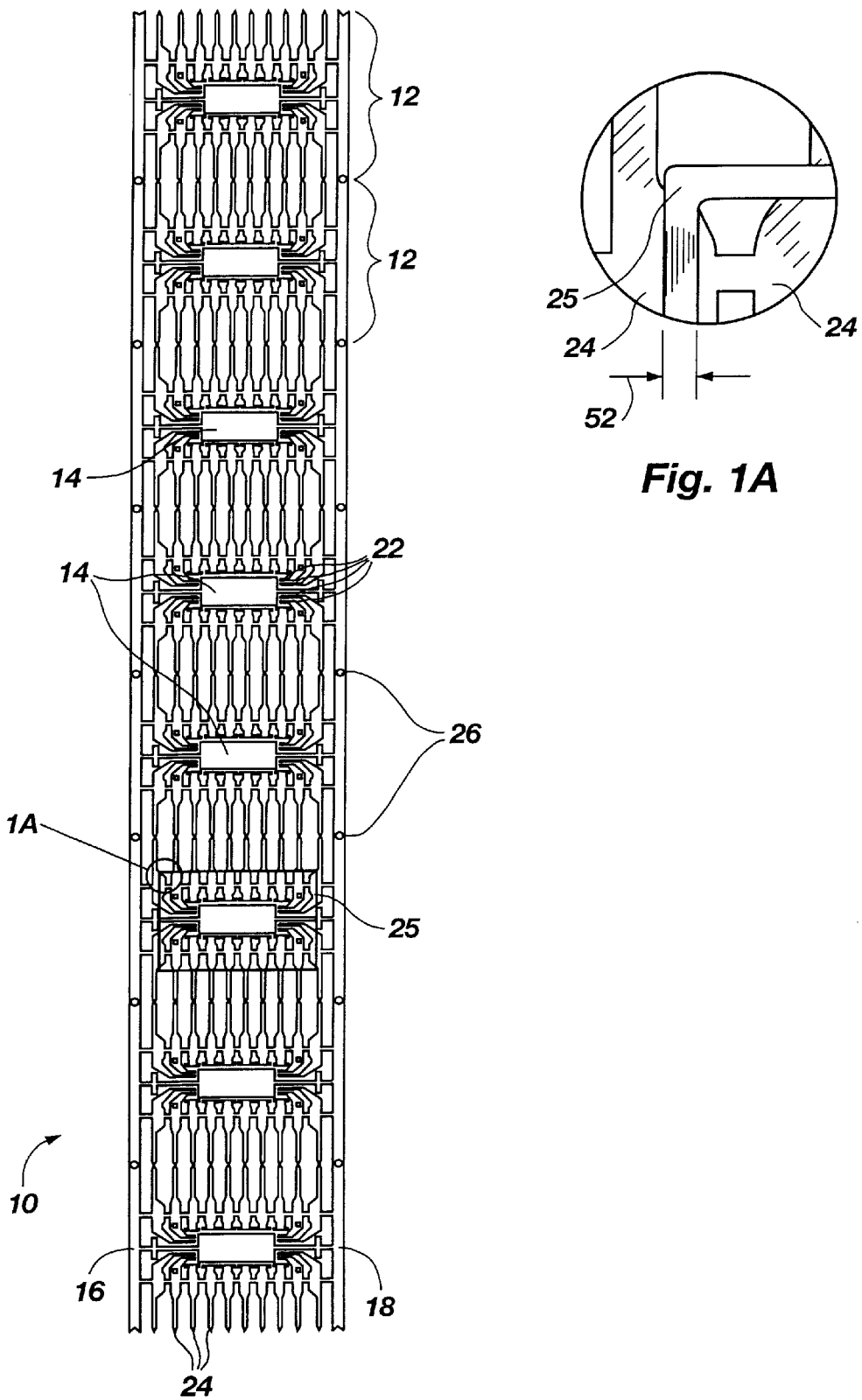
FIG. 1 is a plan view of a prior art semiconductor leadframe strip.
FIG. 1A is an enlarged view of portion 1A of the leadframe strip of FIG. 1.

A representative metal leadframe strip 10 used in semiconductor integrated circuit manufacture is shown in drawing FIG. 1. The leadframe strip 10 is a metallized design configured with several e.g. eight frame sections 12, each frame section having a mounting paddle 14 for mounting a semiconductor device. The leadframe strip 10 includes parallel spaced strip rails 16, 18 formed with a pattern of indexing openings 26 for handling by automated machinery. The leadframe strip 10 includes within each frame section 12 an array of leadfingers 22 adapted for attachment to the bond pads of a semiconductor device 36, hereinafter referred to as a die or dice, during the wire bonding process. In general, the terminal ends 24 of the leadfingers 22 will become the external leads of a completed semiconductor package. In the current technology, the metal thickness 62 (FIG. 2) of single-layer leadframe strips 10 is typically about 20 to 40 $\mu$m but may be any thickness which permits accurate wirebonding and sufficient strength of the finished leads for the intended purpose.

In the manufacturing process, the leadframe strip 10 is typically treated as a unit from attachment of the dice to the paddles 14 up until separation of the individual frame sections 12 of the leadframe strip into unit packaged semiconductor devices.

In the wirebonding apparatus and process as practiced with the present invention, a lower clamp member is a planar surface of e.g. a wirebonding machine platform and/or block heater, and an upper clamp member e.g. clamp insert clamps a narrow peripheral portion 25 about the die and adjacent leadfingers. The dimensions of the peripheral portion 25 are configured to provide sufficient room for access of the wirebonding arm to the leadfingers and die, and immobilizing the leadfingers. The clamping apparatus is illustrated in detail in the following figures and description.

Figure 2:
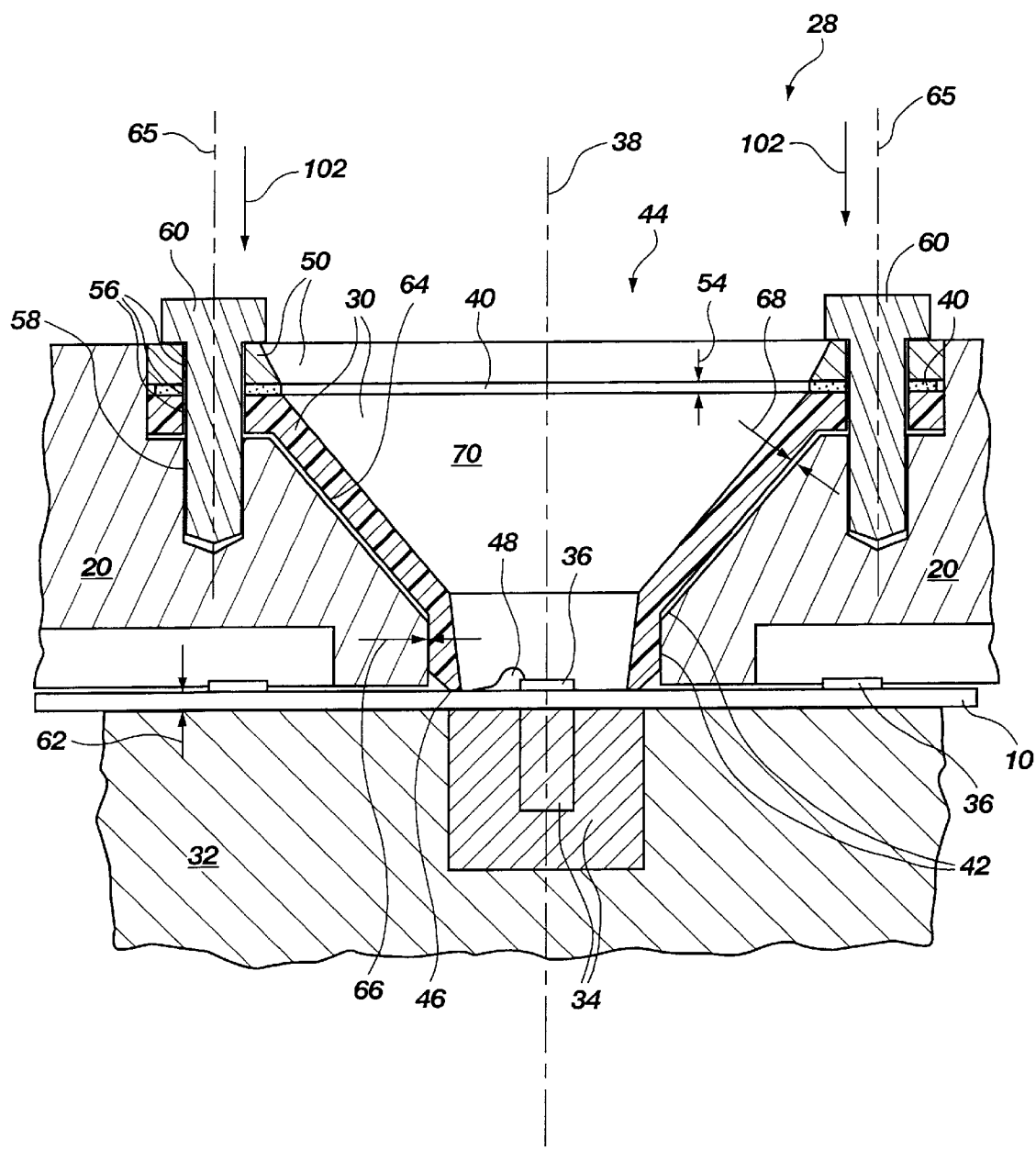
FIG. 2 is an enlarged cross-sectional side view of a leadframe clamping apparatus of the invention.

Turning to drawing FIG. 2, a general representation of the leadframe clamping apparatus 28 of the invention is shown in cross-section. For the sake of illustration, the portions of the leadframe clamping apparatus 28 on each side of centerline 38 are mirror images of each other.

A wirebonding platform 32 of a bonding machine is shown with a block heater 34 for heating die 36 and leadfingers (leads) 22 of leadframe strip 10 for the wirebonding operation. The platform 32 generally comprises a lower clamp member for holding the leadframe strip 10 while conductive wires 48 are bonded to the leadframe and die 36. The exemplary leadframe clamping apparatus 28 includes (in addition to the platform 32) a clamp insert carrier 20, a clamp insert 30 which rides in the carrier 20, a thin resilient member 40, and a clamp insert retainer 50. The clamp insert carrier 20 is generally configured to clamp the opposing strip rails 16, 18 (not shown in FIG. 2) of the leadframe 10. An insert window 42 in the clamp insert carrier 20 is configured to hold a clamp insert 30 which has a wirebonding window 44 with a lower peripheral surface 46. The lower peripheral surface 46 comprises an upper clamping surface which engages the upper surface of the leadframe 10 about the die 36 for wirebonding, the surface 46 corresponding to peripheral clamping surface 25 in drawing FIGS. 1 and 1A.

The clamp insert 30 and the overlying resilient member 40 are retained in position in the insert carrier 20 by retainer 50 which may be e.g. a metal plate. As mounted, the retainer 50, resilient member 40 and insert 30 have coaxial threaded holes 56 through which threaded fasteners 60, such as screws, are threaded into threaded holes 58 along axes 65 in the insert carrier 20. As mounted, the insert 30 is capable of tilting a slight degree in any direction within the insert carrier 20 to compensate for variations in the thickness 62 of the leadframe strip 10.

Upon completion of wirebonding a frame section 12, the clamping apparatus 28 including the insert carrier 20, insert 30, resilient member 40 and retainer 50 are lifted from the leadframe strip 10 and the strip advanced to the next frame section.

For a typical insert 30, the width 52 (FIG. 1) of the lower peripheral surface 46 may vary from about 0.01 to about 0.08 inches (0.254 to 2.032 mm). Thus, an exemplary insert 30 having a rectangular wirebonding window with uniform inner dimensions of 0.25 by 0.45 inches (0.635 by 1.143 cm.) will have a total clamping area of approximately 0.0144 to 0.1376 square inches (0.0929 to 0.8877 square cm.). Although width 52 may be as much as 0.08 inch (2.032 mm) or more, a more preferred range of widths is between about 0.02 and 0.04 inches (0.508 and 1.016 mm), at which the clamping area of the lower peripheral area is between about 0.0264 and 0.0528 square inches (0.17 and 0.34 square cm).

The preferred insert clamping pressure 102 on a typical frame section by this exemplary insert 30 is variable but, typically is in the range of about twenty (20) to about thirty (30) psi.

The total compressible surface area of the resilient member 40 will typically be much larger than the area of the lower peripheral surface 46 of the insert 30. For example, an insert 30 of the above example may have a resilient member compressible area of about 0.50 square inches (3.23 square cm), about 10–20 times the area of lower peripheral surface 46. The area of the resilient member 40 may be varied to provide the desired compensation for leadframe variations, depending upon the stress-strain relationship and thickness 54 of the resilient member 40. Thus, the force necessary to achieve a desired compensation may be calculated and enabled by using a resilient member 40 of a particular material, thickness 54 and area. Typically, the thickness 54 of the resilient member 40 is in the range of about 0.005 to 0.1 inches (0.0125 to 0.25 cm.). Members 40 of differing clamping areas may be provided for a particular insert carrier 20, and selectable for inserts with particular window sizes and clamping areas. The members 40 may be quickly and easily interchanged, for example, by removing four screw fasteners.

As an example, a clamping apparatus 28 of the invention may be configured for a maximum dimensional compensation (insert movement or tilting) of about 0.0002 to 0.02 inches (0.0005 to 0.05 cm.). The compensation movement is to be absorbed by a resilient member 40 of about 0.005 to 0.1 inch (0.0125 to 0.25 cm.) thickness.

The clamping insert 30 has an enlarged upper portion 70 in which the wirebonding window 44 has expanded dimensions for accommodating the bonding machine head, not shown. The clearances 66, 68 between the outer wall surfaces 64 of the insert 30 and the insert window 42 of the insert carrier 20 are configured to provide a desired tiltability of the insert 30.

The clamping insert 30 is preferably formed of a polymeric material such as polyimide. Vespel polyimide material, a trademarked material produced by DuPont, has been found to be very suitable, although other polymers with similar mechanical, electrical and heat conduction properties may be used.

Exemplary embodiments of the present invention for use on a Kulicke & Soffa Industries model 1484 wirebonding machine are depicted in drawing FIGS. 3 through 11. Other suitable wirebonding machines are commercially available from a variety of manufacturers, including (in addition to K & S), Shinkawa, Kiajo Denki, and ESEC.

In the remaining drawing FIGS. 3 through 11, the leadframe strip 10 is not illustrated or pictured, but it is understood that the wirebonding clamp apparatus 28 is for clamping a leadframe strip to an underlying wirebond machine platform, with a bonding site of the leadframe strip i.e. die and leadfingers accessible through the wirebonding window of the clamp insert 30.

Figure 3:
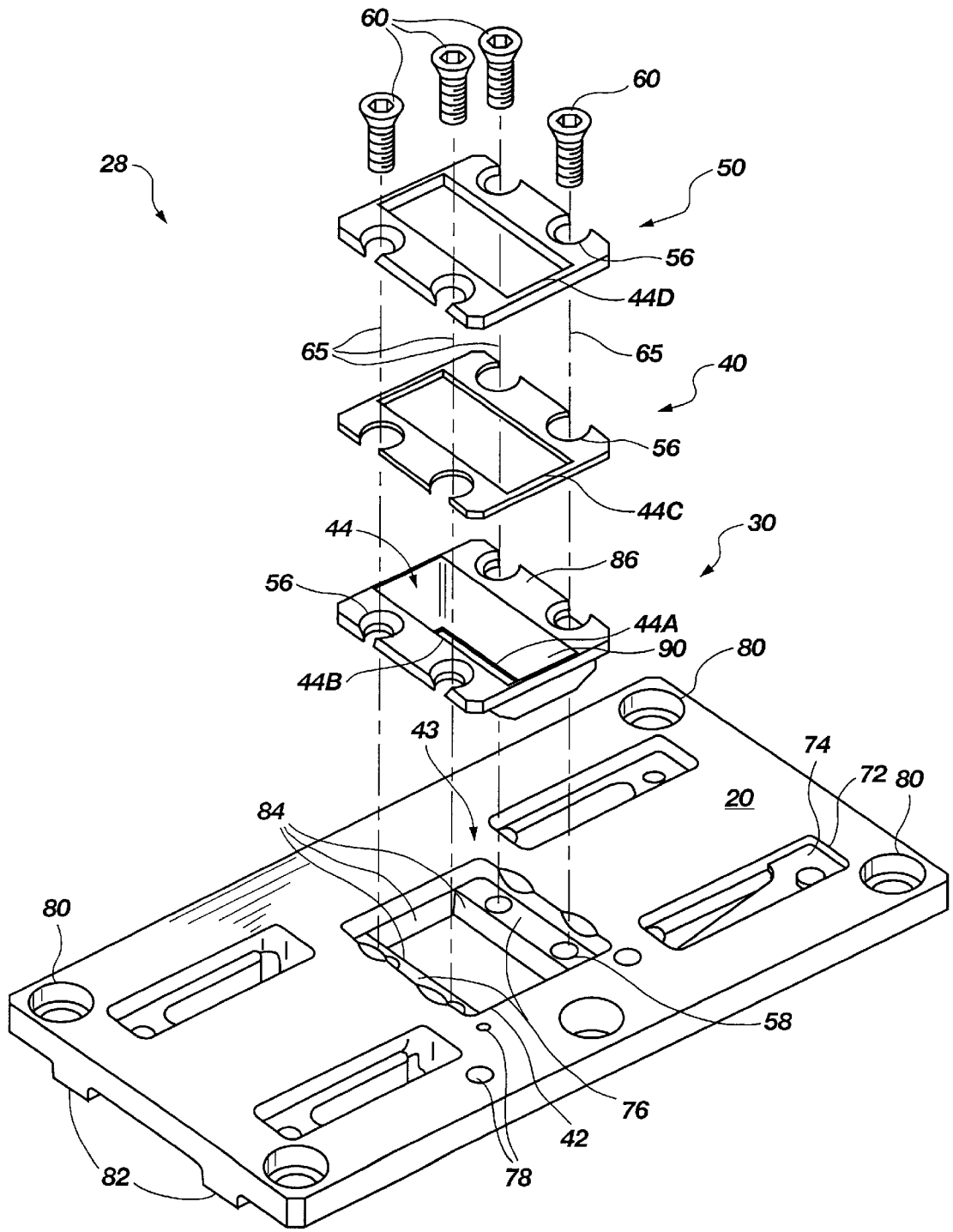
FIG. 3 is an exploded isometric view of a leadframe clamping apparatus of the invention including a clamp insert, a clamp carrier, a dampener/compensator layer and a retainer.
Figure 4:
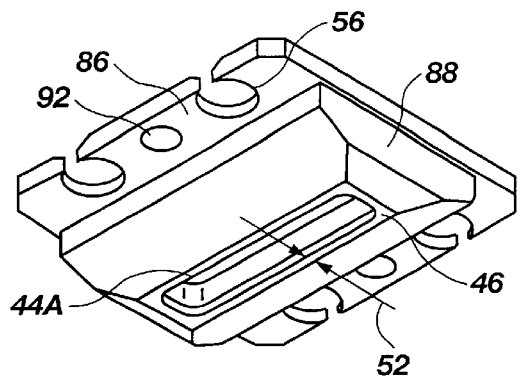
FIG. 4 is an isometric bottom view of a clamp insert of the invention.
Figure 5:
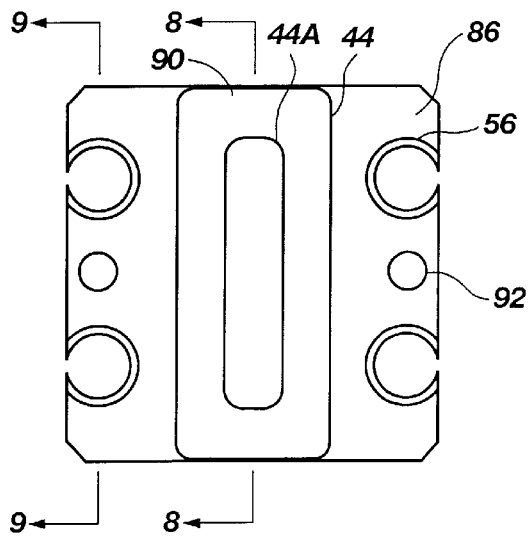
FIG. 5 is a top view of a clamp insert of the invention.
Figure 6:
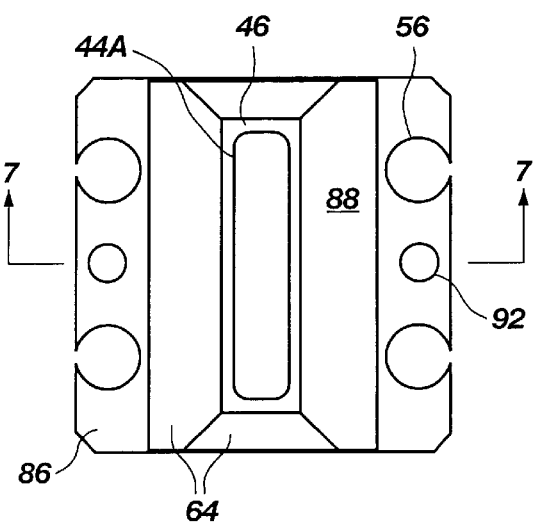
FIG. 6 is a bottom view of a clamp insert of the invention.
Figure 7:
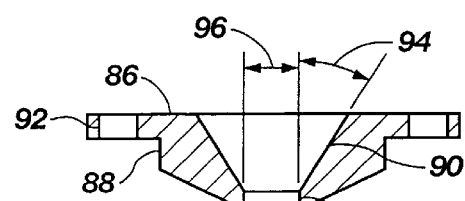
FIG. 7 is a cross-sectional end view of a clamp insert of the invention, as taken along line 7—7 of FIG. 6.
Figure 9:
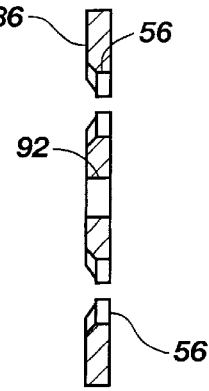
FIG. 9 is a cross-sectional side view through a flange of a clamp insert of the invention, as taken along line 9—9 of FIG. 5.
Figure 8:
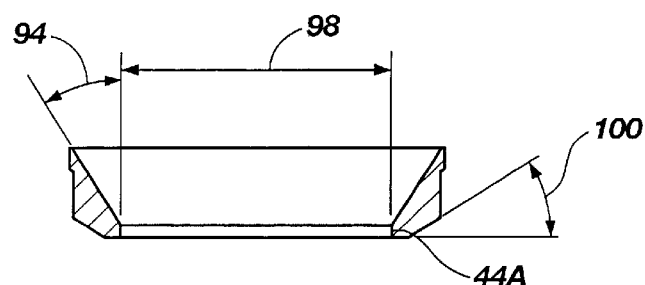
FIG. 8 is a cross-sectional side view of a clamp insert of the invention, as taken along line 8—8 of FIG. 5.

As depicted in drawing FIG. 3, a clamping apparatus 28 of the invention for wirebonding LOC and SOJ devices uses an insert carrier 20 with holes 72 for mounting leaf spring members 74. Such leaf spring members 74 are downwardly biased and push the leadframe strip 10 away from the clamp insert carrier 20 and insert 30 when the carrier is lifted for moving the leadframe strip. The leaf spring members 74 are disclosed in U.S. Pat. No. 5,322,207, commonly assigned to the assignee of the present invention. As described in that publication, the insert carrier 20 also has holes 78 and 80 for aligning the carrier with the lower clamp member (not shown), the upper compression force driver (not shown), and the leadframe strip 10.

The surface 43 of insert window 42 of the carrier 20 is shown with subsurface stages 76 upon which the clamp insert 30 is mounted by threaded fasteners 60 seated in threaded holes 58. When fully seated and at its lowermost position in the insert window 42, the lower peripheral surface 46 (see drawing FIGS. 4, 6) of width 52 is below the lower surface 82 of the carrier 20 and biased downwardly by the retainer 50 and intervening resilient dampening/compensating/adjusting/aligning member 40. The exemplary insert window 42 is shown with sloping walls 84. The insert carrier 20, clamping insert 30, member 40 and retainer 50 are joined and held together by threaded fasteners 60 threaded into holes 58 along axes 65 in the insert carrier. The threaded fasteners 60 are fastened to the carrier 20 such that the insert 30 may be pushed upwardly against the resilient member 40, which resists upward movement of the insert but permits a slightly tilted or canted engagement of the insert against it. Thus, the resilient member 40 permits self-leveling of the clamp insert 30 to compensate for non-uniformity of leadframe thickness 62.

The embodiment of polymeric clamp insert 30 shown in drawing FIGS. 3 through 9 is particularly configured for wirebonding a leads-on-chip (LOC) semiconductor package with small-outline J-bends (SOJ). The clamp insert 30 has a mounting flange 86 and a window frame 88 which is peripheral to the wirebonding window 44 and extends downwardly to a lowermost window opening 44A. The inner walls 90 of the window frame 88 may be sloped from a relatively large upper window opening 44B at angle 94 as shown to provide working room for the automated wirebonder to operate. The inner walls 90 are dimensioned and shaped to achieve operating room for wirebonding a device requiring a particular sized lowermost window opening 44A. The general dimensions of the lowermost window opening 44A are shown as width 96 and length 98. The flange 86 may include alignment holes 92 to accurately position the insert 30 within the insert carrier 20. The outer wall surfaces 64 of the clamping insert 30 may be partially sloped, such as at angle 100.

As depicted in drawing FIG. 3, the resilient member 40 is a thin member of e.g. polytetrafluoroethylene or urethane which has a window 44C which generally is about equivalent to window 44B in dimensions. The resilient member 40 may be stamped or cut to the desired dimensions for placement atop the clamping insert 30. The resilient member 40 is shown with threaded holes 56 for passage of threaded fasteners 60. The preferred materials of construction have a coefficient of compression of between about fourteen (14) and about 35 mpA @ 1% of strain and a permanent deformation point which is sufficiently high to be unattained in this application. As already noted, the thickness 54 of the resilient member 40 is between about 0.005 and about 0.1 inch (0.0125 and 0.25 cm), depending upon its mechanical properties, expected variation in leadframe thickness 62, clamping pressure, and configuration of the clamping insert 30.

The retainer 50 is shown as a flat plate with window 44D and threaded holes 56 which generally match those of the resilient member 40.

Figure 10:
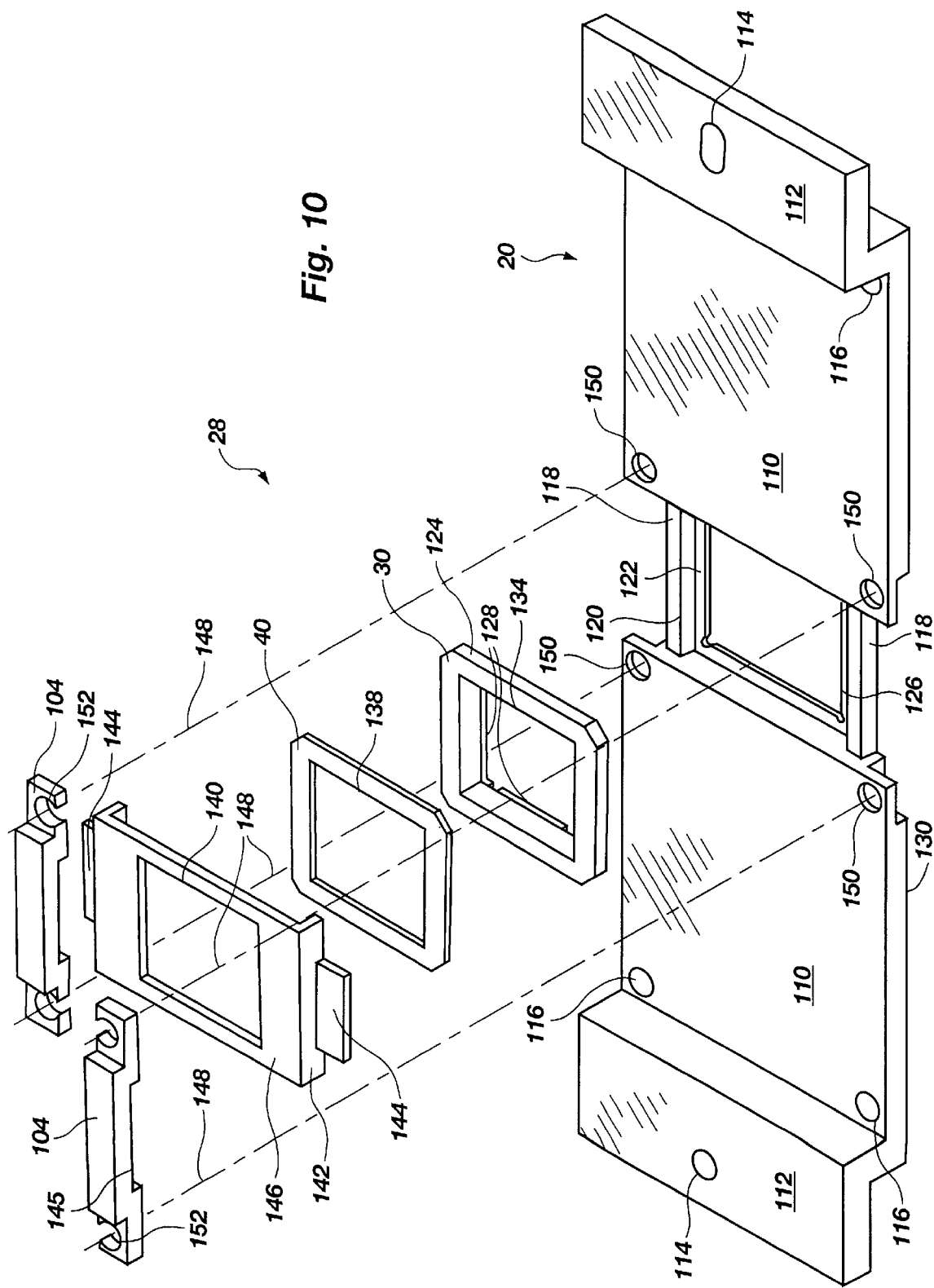
FIG. 10 is an exploded isometric view of another embodiment of a leadframe clamping apparatus of the invention including a clamp insert, a clamp insert carrier, a dampener/compensator layer and a retainer plate with lockbars.

Referring to drawing FIG. 10, another embodiment of the invention is depicted as using a "universal" clamp insert carrier 20 having a shape similar to that disclosed in U.S. Pat. No. 5,307,978. In that reference, the insert carrier 20 has a simple window merely comprising a hole, and is held immobile by a clamp frame member at each end of the carrier. The underlying leadframe strip 10 is movable in x, y, z and theta directions for positioning during wirebonding.

As shown in drawing FIG. 10, the clamp insert carrier 20, as modified in accordance with the invention, comprises flat plate portions 110, each with an upturned flanged end 112. The flanged ends 112 are fixed to the base of a work station, not shown, by e.g. threaded fasteners passed through apertures 114. Additional apertures 116 may be provided for alignment of the insert carrier 20 with the underlying platform and leadframe strip, not shown in this figure.

A centrally located insert window 120 is sited between two endframe members 118. A generally horizontal matte portion 122 limits downward movement of a clamping insert 30 and defines the lowermost open window portion 126 of the insert window 120.

The clamping insert 30 (see FIGS. 10 and 11) is a simple window frame with wirebonding window 134, and fits into the insert window 120. The insert 30 has a flange portion 124 which mounts on the matte portion 122, and a lower peripheral portion 128 which extends downwardly through the lowermost window portion 126 of the insert window 120 of the carrier 20, to be below the lower surface 130 of the carrier. As in the embodiment already described herein, the bottom surface 132 of the lower peripheral portion 128 engages and clamps downwardly on the leadframe strip about the die and leadfinger ends of a frame section. The lower peripheral portion 128 of the insert 30 is shown with slots 136, whose purpose is to provide clearance for the tie bars connecting the die paddle to other portions of the leadframe that are not clamped during the wire bonding operations. The insert window 120 and insert 30 are configured to have a limited degree of linear vertical and tilting motion, so that the bottom surface 132 comprising an upper clamp may be self-leveling or self-adjusting on the leadframe.

As already indicated, the insert 30 is preferably formed of a polymeric material such as polyimide.

Figure 11:
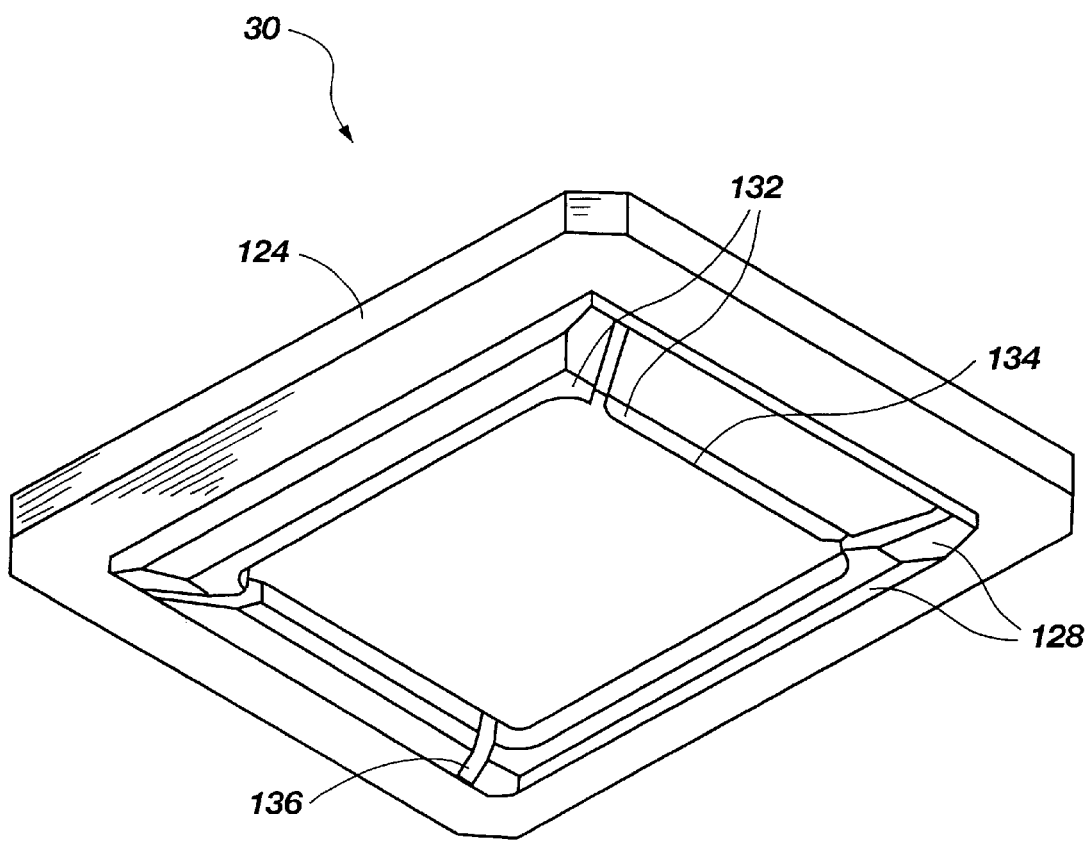
FIG. 11 is a bottom isometric view of a clamp insert insertable in the insert carrier of FIG. 10.

While the exemplary insert 30 shown in drawing FIGS. 10 and 11 is designed for wirebonding of a thin-quad-flat-pack (TQFP) device, the window may be shaped and sized to accommodate any other packaging designs and sizes, including those with multi-level leads. The wirebonding window 134 may be of any shape and size for wirebonding a particular die-leadframe combination. Thus, the wirebonding window 134 may be round or octagonal, for example.

The resilient member 40 is formed of a thin sheet of material, e.g. polytetrafluoroethylene material or urethane material, in which window 138 is formed. The member 40 absorbs upwardly directed forces of the insert 30 as a clamping force is applied. The resistance of member 40 may be varied by varying its thickness and planar surface area, and/or using a different material.

The retainer 50 is depicted as a cover plate with turned-down ends 142 with tabs 144, and a window 140 in its horizontal surface 146. The retainer 50 holds the clamping insert 30 in the insert window 120 and holds the resilient member 40 atop the retainer. As shown, each of two lock bars 104 has a lower indent 146 into which a retainer tab 144 fits. The lock bars 104 are placed over the two retainer tabs 144 and attached by suitable threaded fasteners, not shown, through holes 152 and along axes 148 into threaded holes 150.

As shown in drawing FIG. 10, the insert 30, member 40 and retainer 50 are formed without any threaded holes, thus simplifying their construction.

The leadframe clamping apparatus 28 may be advantageously used for wirebonding a tape-under-frame (TUF) device configuration. In TUF, the lead pattern is formed on a tape. During wirebonding, the tape, rather than the metal lead pattern, is directly exposed to the heating block. The variation in thickness of the leadframe-tape combination often makes effective clamping difficult. The selfleveling or self-adjusting feature of the clamping apparatus 28 overcomes this problem.

There are numerous advantages to the clamping apparatus 28 as described herein. First, movement of leadfingers during wirebonding is avoided, enabling more uniform and precise bonding. In addition, heat losses through the clamping apparatus are reduced because of the low heat transfer of the insert. Consistent bonding temperatures are achieved across all leads of the leadframe strip. Thus, the rate of wirebond rejection may be significantly decreased.

Clamping inserts 30 may be quickly and cheaply made of polymeric material without grinding, polishing or heat treatment. They may be formed in a variety of designs and dimensions for every type and size of package which is to be made. The inserts 30 may be easily and quickly interchanged without distorting a tool setup. Where the heating block does not need to be interchanged, for example, in converting from a LOC to a TUF device, conversion is very quick.

Interchangeable resilient members 40 may be punched out of inexpensive sheet material to achieve any desired correction of dimensional variation in a leadframe. A minimum of storage space is required for storing a supply of replacement members 40 and inserts 30 in all useful styles/sizes/materials.

The insert 30 and resilient member 40 may be used repeatedly without damage because, in use, the permanent deformation pressure is never attained.

The net result of using the apparatus is a reduction in time from the design stage to commercial production. Furthermore, the tooling costs may be much decreased. In addition, the rejection rate is decreased, resulting in greater profitability.

Preliminary tests have shown an improvement in bond pull and shear tests, and lower rejection rates than is otherwise achieved.

It is apparent to those skilled in the art that various changes, additions and modifications may be made in the improved leadframe clamping apparatus as disclosed herein without departing from the spirit and scope of the invention as defined in the following claims.

What is claimed is:

1. A method of adjusting clamping apparatus in a leadframe clamp, said method comprising the steps of:

providing a lower clamping surface for supporting a leadframe strip;

providing an upper clamping member comprising a wirebonding window frame having a window therein adapted to move under a clamping force to engage portions of said leadframe strip underlying said window frame;

providing a resilient member located substantially above said upper clamping member; and compressing said upper clamping member to substantially cause said window frame to engage said portions of said leadframe strip underlying said window frame.

2. The method of adjusting of claim 1, wherein said upper clamping member is formed of a polymeric material.

3. The method of adjusting of claim 1, wherein said upper clamping member is formed of a polyimide material.

4. The method of adjusting of claim 1, wherein said resilient member comprises a polymeric material.

5. The method of adjusting of claim 1, wherein said resilient member comprises one of polytetrafluoroethylene and urethane.

6. The method of adjusting of claim 1, wherein a thickness of said resilient member is approximately 0.005 to approximately 0.1 inches (approximately 0.0125 to 0.25 cm).

7. A method of adjusting clamping apparatus in a leadframe clamp used in electrically connecting a semiconductor device to a leadframe, said method comprising the steps of:

providing a lower clamping surface for supporting a leadframe strip;

providing an upper clamping member comprising a wirebonding window frame having a window therein adapted to move under a clamping force to engage portions of said leadframe strip underlying said window frame;

providing a resilient member located substantially above said upper clamping member; and compressing said upper clamping member to substantially cause said window frame to engage said portions of said leadframe strip underlying said window frame.

8. The method of adjusting of claim 7, further comprising the steps of:

providing a semiconductor device connected to said leadframe strip; and electrically connecting portions of said leadframe strip to portions of said semiconductor device.

9. The method of adjusting of claim 7, wherein said upper clamping member is formed of a polymeric material.

10. The method of clamping of claim 7, wherein said upper clamping member is formed of a polyimide material.

11. The method of adjusting of claim 7, wherein said resilient member comprises a polymeric material.

12. The method of adjusting of claim 7, wherein said resilient member comprises one of polytetrafluoroethylene and urethane.

13. The method of adjusting of claim 7, wherein a thickness of said resilient member is approximately 0.005 to approximately 0.1 inches (approximately 0.0125 to 0.25 cm).

* * * * *

UNITED STATES PATENT AND TRADEMARK OFFICE
CERTIFICATE OF CORRECTION

PATENT NO. : 6,126,062
DATED : October 3, 2000
INVENTOR(S) : Evers et al.

It is certified that error appears in the above-identified patent and that said Letters Patent is hereby corrected as shown below:

Title page,
Item [56], "References Cited" under "U.S. PATENT DOCUMENTS",
after 1st entry, insert:

| | | |
|---|---|---|
| -- 5,043,534 | 8/1991 | Mahulikar et al. |
| 5,066,614 | 11/1991 | Dunaway et al. --; | after 6th entry, insert:

| | | |
|---|---|---|
| -- 5,233,131 | 8/1993 | Liang et al. --; | after 8th entry, insert:

| | | |
|---|---|---|
| -- 5,328,870 | 7/1994 | Marrs |
| 5,336,272 | 8/1994 | Tsutsumi et al. |
| 5,366,933 | 11/1994 | Golwalkar et al. --; | after 16th entry, insert:

| | | |
|---|---|---|
| -- 5,673,479 | 10/1997 | Hawthorne |
| 5,815,000 | 9/1998 | Farnworth et al. --; and | after 18th entry, insert:

| | | |
|---|---|---|
| -- 5,891,377 | 4/1999 | Libres et al. |
| 5,923,538 | 6/1999 | Hawthorne --. |

Column 1,
Line 17, change "dual in-Line" to -- dual inline --;
Line 18, change "J-bends" to -- J-leads --;
Line 56, change "leadfingers" to -- leadfinger --;

Column 2,
Line 17, change "leadfingers" to -- leadfinger --;
Line 61, after "substrate" change "," to -- , -- and change "leadframe" to
-- a leadframe, --;

Column 3,
Line 62, change "much" to -- significantly --;

Column 4,
Line 46, after "36" but before "," insert -- (FIG. 2) --;
Line 57, before "paddles" insert -- mounting --;
Lines 64 and 65, change "portion" to -- surface --;

UNITED STATES PATENT AND TRADEMARK OFFICE
CERTIFICATE OF CORRECTION

PATENT NO. : 6,126,062
DATED : October 3, 2000
INVENTOR(S) : Evers et al.

It is certified that error appears in the above-identified patent and that said Letters Patent is hereby corrected as shown below:

Column 5,
Line 11, after "22" insert -- (not shown) --;
Line 12, after "The" insert -- wirebonding --;
Line 16, after "the" insert -- wirebonding --;
Line 17, change "the carrier" to -- the clamp insert carrier --;
Line 21, after "leadframe" insert -- strip --;
Line 26, after "leadframe" insert -- strip -- and before "surface" insert -- lower peripheral --;
Line 30, before "insert" insert -- clamp -- and before "retainer" insert -- clamp insert --;
Line 31, before "retainer" insert -- clamp insert --;
Lines 32 and 36, before "insert" insert -- clamp --;
Line 35, before "insert" (both occurrences) insert -- clamp --;
Line 40, before "clamping" insert -- leadframe --; and before "insert" (both occurrences) insert -- clamp --;
Line 41, before "retainer" insert -- clamp insert --;
Lines 44 and 46, before "insert" insert -- clamp --;
Line 58, before "insert" insert -- clamp --; and after "but" delete ",";
Line 63, before "insert" insert -- clamp -- and change "an" to -- a --;

Column 6,
Line 9, change "Members" to -- Resilient members --;
Line 10, before "insert" insert -- clamp --;
Line 12, before "members" insert -- resilient --;
Line 15, before "clamping" insert -- leadframe --;
Line 21, change "clamping" to -- clamp --;
Line 25, before "insert 30" insert -- clamp --;
Lines 26 and 27, before "insert" insert -- clamp --;
Line 28, change "clamping" to -- clamp --;
Lines 36 and 40, change "drawing" to -- drawings --;
Line 42, change "wirebonding clamp" to -- leadframe clamping --;
Line 47, before "clamping" insert -- leadframe --;
Line 49, change "an insert" to -- a clamp insert --;
Line 51, after "10" insert -- (not shown) --;
Line 52, change "insert 30" to -- clamp insert 30 -- and change "the carrier" to -- the clamp insert carrier 20 --;
Line 53, after "strip" but before "." insert -- 10 --;
Line 56, before "insert" insert -- clamp --;
Line 57, change "carrier" to -- clamp insert carrier 20 --;
Line 60, before "carrier" insert -- clamp insert --;
Line 65, change "drawing" to -- drawings --;
Line 66, before "carrier" insert -- clamp insert --;

UNITED STATES PATENT AND TRADEMARK OFFICE
CERTIFICATE OF CORRECTION

PATENT NO.    : 6,126,062
DATED         : October 3, 2000
INVENTOR(S)   : Evers et al.

It is certified that error appears in the above-identified patent and that said Letters Patent is hereby corrected as shown below:

Column 7,
Line 1, before "retainer" insert -- clamp insert --;
Line 4, change "insert carrier 20, clamping insert 30, member 40, and" to -- clamp insert carrier 20, clamp insert 30, resilient member 40, and clamp insert --;
Line 6, before "holes" insert -- threaded -- and change "insert carrier" to -- clamp insert carrier 20 --;
Line 7, before "carrier" insert -- clamp insert --;
Line 8, before "insert" insert -- clamp --;
Line 9, change "insert" to -- clamp insert 30, --;
Line 11, before "insert" insert -- clamp --;
Line 15, change "drawing" to -- drawings --;
Line 17, change "J-bends" to -- J-leads --;
Line 29, before "flange" insert -- mounting --;
Line 30, before "insert" (both occurrences) insert -- clamp --;
Lines 31 and 38, change "clamping" to -- clamp --;
Line 43, change "unattained" to -- unattainable --;
Line 47, after "leadframe" insert -- strip --;
Line 48, change "clamping insert" to -- clamp insert --;
Line 50, before "retainer" insert -- clamp insert --;
Line 56, before "insert" insert -- clamp --;
Line 59, after "10" insert -- (not shown) --;

Column 8,
Line 1, before "insert" insert -- clamp --;
Lines 5 and 8, change "clamping" to -- clamp --;
Line 9, after "with" insert -- a --;
Line 10, change "The insert" to -- The clamp insert --;
Line 13, after "lowermost" insert -- open --;
Lines 14 and 15, before "carrier" insert -- clamp insert --;
Line 19, before "insert" insert -- clamp --;
Line 23, change "and insert" to -- and clamp insert --;
Line 28, before "insert" insert -- clamp --;
Line 30, before "insert" insert -- clamp -- and change "drawing" to -- drawings --;
Line 40, before "member" insert -- resilient --;
Line 41, before "insert" insert -- clamp --;
Line 42, before "member" insert -- resilient --;
Line 45, before "retainer" insert -- clamp insert --;
Line 47, before "retainer" insert -- clamp insert -- and change "clamping" to -- clamp --;
Line 50, change "146" to -- 145 --;

UNITED STATES PATENT AND TRADEMARK OFFICE
CERTIFICATE OF CORRECTION

PATENT NO.    : 6,126,062
DATED         : October 3, 2000
INVENTOR(S)   : Evers et al.

It is certified that error appears in the above-identified patent and that said Letters Patent is hereby corrected as shown below:

Column 8 cont'd,
Line 55, before "insert" insert -- clamp -- and before "member" insert -- resilient --;
Line 56, before "retainer" insert -- clamp insert --;
Line 64, change "selfleveling" to -- self-leveling --;
Line 65, before "clamping" insert -- leadframe --;

Column 9,
Line 1, before "clamping" insert -- leadframe --;
Line 4, after "the" insert -- leadframe --;
Line 6, before "insert" insert -- clamp --;
Line 9, change "Clamping" to -- Clamp --;
Line 13, before "inserts" insert -- clamp --;
Line 21, before "members" insert -- resilient -- and before "inserts" insert -- clamp --;
Line 23, before "insert" insert -- clamp --; and
Line 28, change "much" to -- significantly --.
Line 47, after "underlying said" insert -- wirebonding --;

Column 10,
Lines 2 and 3, before "window" insert -- wirebonding --;
Line 24, after "underlying said" insert -- wirebonding -- ;
Lines 29 and 30, before "window" insert -- wirebonding --;
Line 33, change "a" to -- said --;
Line 45, after "connecting" insert -- said --; and
Line 49, change "clamping" to -- adjusting --.

Signed and Sealed this

Eighteenth Day of June, 2002

*Attest:*

JAMES E. ROGAN
*Attesting Officer*     *Director of the United States Patent and Trademark Office*